United States Patent
Ewe et al.

(10) Patent No.: US 9,059,155 B2
(45) Date of Patent: Jun. 16, 2015

(54) CHIP PACKAGE AND METHOD FOR MANUFACTURING THE SAME

(71) Applicant: Infineon Technologies Austria AG, Villach (AT)

(72) Inventors: Henrik Ewe, Burglengenfeld (DE); Anton Prueckl, Schierling (DE); Joachim Mahler, Regensburg (DE); Frank Daeche, Unterhaching (DE); Josef Hoeglauer, Heimstetten (DE); Riccardo Pittassi, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 13/803,108

(22) Filed: Mar. 14, 2013

(65) Prior Publication Data

US 2014/0264790 A1 Sep. 18, 2014

(51) Int. Cl.
*H01L 23/48* (2006.01)
*H01L 23/495* (2006.01)
*H01L 23/538* (2006.01)
*H01L 23/00* (2006.01)
*H01L 23/498* (2006.01)

(52) U.S. Cl.
CPC ..... *H01L 23/49572* (2013.01); *H01L 23/49575* (2013.01); *H01L 23/49816* (2013.01); *H01L 23/5389* (2013.01); *H01L 24/19* (2013.01); *H01L 2924/13091* (2013.01); *H01L 2924/13062* (2013.01); *H01L 2924/1306* (2013.01); *H01L 2924/13055* (2013.01); *H01L 2924/1305* (2013.01)

(58) Field of Classification Search
CPC .............. H01L 23/49572; H01L 24/19; H01L 23/5389; H01L 2924/1305; H01L 2924/13055; H01L 2924/1306; H01L 2924/13062; H01L 2924/13091; H01L 23/49816; H01L 23/49575
USPC ............ 257/E21.502, 737, E21.499, E23.01, 257/E21.506, E23.068, E23.011, E23.021
See application file for complete search history.

(56) References Cited

U.S. PATENT DOCUMENTS

| 8,030,131 | B2 | 10/2011 | Otremba et al. | |
| 8,120,158 | B2 | 2/2012 | Ewe et al. | |
| 8,604,615 | B2 * | 12/2013 | Lee et al. | 257/737 |
| 2009/0230535 | A1 * | 9/2009 | Otremba et al. | 257/690 |
| 2012/0304460 | A1 * | 12/2012 | Kimura et al. | 29/850 |
| 2013/0009270 | A1 * | 1/2013 | Tsai et al. | 257/459 |

* cited by examiner

*Primary Examiner* — Roy Potter
*Assistant Examiner* — Paul Patton

(57) ABSTRACT

Various embodiments provide a chip package. The chip package may include a metallic chip carrier; at least one chip carried by the metallic chip carrier; encapsulation material encapsulating the at least one chip and the metallic chip carrier; and a plurality of redistribution layers disposed over the at least one chip opposite the metallic chip carrier, wherein at least one redistribution layer of the plurality of redistribution layers is electrically coupled with the at least one chip.

24 Claims, 7 Drawing Sheets

CHIP PACKAGE AND METHOD FOR MANUFACTURING THE SAME

TECHNICAL FIELD

Various embodiments relate generally to a chip package and a method for manufacturing the same.

BACKGROUND

Existing technologies in the chip embedded packages are based on the redistribution of individual semiconductor circuits on both sides. Embedded chip carriers having the chips mounted thereon are usually electrically contacted, re-wired (i.e., redistributed) and electrically connected to the periphery by means of a so-called redistribution layer. In this way, it may not be possible to realize a flexible "foot print", wherein the approach of the chips facing down is of particular relevance for the connection to the printed circuit board (PCB).

SUMMARY

Various embodiments provide a chip package. The chip package may include a metallic chip carrier; at least one chip carried by the metallic chip carrier; encapsulation material encapsulating the at least one chip and the metallic chip carrier; and a plurality of redistribution layers disposed over the at least one chip opposite the metallic chip carrier, wherein at least one redistribution layer of the plurality of redistribution layers is electrically coupled with the at least one chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a chip package design having a flexible foot print.

Figure 1:
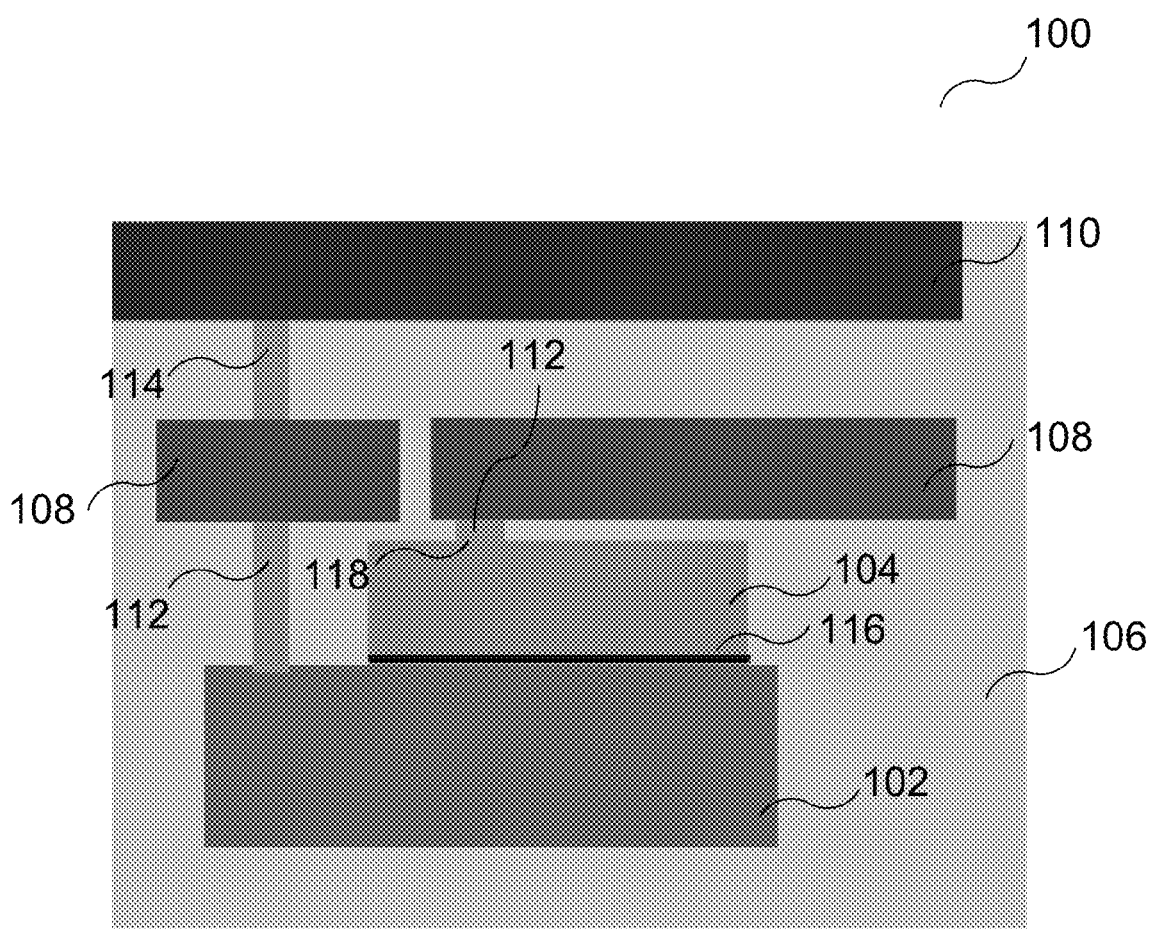
FIG. 1 shows a chip package according to various embodiments.

FIG. 1 shows a chip package 100 according to various embodiments.

As shown in FIG. 1, the chip package 100 may include a metallic chip carrier 102; at least one chip 104 carried by the metallic chip carrier 102; and encapsulation material 106 encapsulating the at least one chip 104 and the metallic chip carrier 102. The chip package 100 may further include a plurality of redistribution layers 108, 110 disposed over the at least one chip 104 opposite the metallic chip carrier 102, wherein at least one redistribution layer of the plurality of redistribution layers 108, 110 is electrically coupled with the at least one chip 104.

In various embodiments as shown in FIG. 1, at least two redistribution layers, e.g. a first redistribution layer 108 and a second redistribution layer 110, are disposed over the at least one chip 104. The second redistribution layer 110 may provide a better disentangling in the z-direction (i.e. the direction perpendicular to the main surfaces of the chip 104) and may thus provide an improved dielectric strength of the chip package 100. It is understood that in various embodiments various number of redistribution layers (e.g., three, four, five, . . . ) may be included in the chip package 100 for electrical coupling with the at least one chip 104.

In various embodiments, the chip package 100 may further include at least one contact hole 112 extending through the encapsulation material 106 to electrically couple the at least one chip 104 with the at least one redistribution layer of the plurality of redistribution layers (e.g. the first redistribution layer 108).

In various embodiments, the chip package 100 may further include at least one further contact hole 114 extending through the encapsulation material 106 to electrically couple the plurality of redistribution layers 108, 110 with each other.

In various embodiments, the at least one chip 104 may include at least a first contact 116 on a first chip side (e.g. the bottom side) and a second contact 118 on a second chip side (e.g. the top side) opposite the first chip side.

In the context of this description, the first side may also be referred to as "bottom side" or "back side" of the chip. The terms "first side", "back side", or "bottom side" may be used interchangeably hereinafter. The second side may also be referred to as a "top side", "front side" or "upper side" of the chip. The terms "top side", "second side", "front side" or "upper side" may be used interchangeably hereinafter.

In various embodiments, the first contact 116 may be electrically coupled to the metallic carrier 102. The second contact 118 may be electrically coupled to at least one redistribution layer of the plurality of redistribution layers, e.g. the first redistribution layer 108.

In various embodiments, the at least one chip 104 may include a field effect transistor. In this case, the first contact 116 may be a drain contact, and the second contact 118 may be a gate contact. The chip 104 may further include a source contact (not shown in FIG. 1).

In various embodiments, the at least one chip 104 may include a bipolar transistor. In this case, the first contact 116 may be a collector contact, and the second contact 118 may be a base contact. The chip 104 may further include an emitter contact (not shown in FIG. 1).

The at least one chip 104 may have a vertical structure in which a current may flow vertically through the chip 104 from one main surface to the opposite other main surface of the chip 104. In other words, the current can flow in a direction perpendicular to the main surfaces of the chip 104. The chip 104 having a vertical structure may have contacts on its front side and back side. By way of example, the drain contact 116 of a power MOSFET chip 104 may be arranged on the first (main) side of the chip 104, while the gate contact and the source contact of the power MOSFET chip 104 may be arranged on the second (main) side of the chip 104 so as to provide a vertical current flow through the chip 104 between the drain region over the first chip side and the source region over the second chip side.

In various embodiments, the at least one chip 104 may include a power chip. The at least one chip 104 may include a power diode chip and/or a power transistor chip. Examples of the power transistor may include but are not limited to a power MOSFET (metal oxide semiconductor field effect transistor), a JFET (junction field effect transistor), an IGBT (insulated gate bipolar transistor), a power bipolar transistor, or the like.

The metallic chip carrier 102 may include at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy. In various embodiments, the metallic chip carrier 102 may include at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

The metallic chip carrier 102 may include a material including a roughness ranging from about 1 nm to about 1000 nm. In various embodiments, the metallic chip carrier 102 may include a material having a porosity ranging from about 2% to about 50%.

In various embodiments, the encapsulation material 106 may include or may be a material selected from a group of materials consisting of: mold material (e.g. press mold material) and lamination material (e.g. polymer material with glass fibers). The encapsulation material 106 may include at least one from the following group of materials, the group consisting of: filled or unfilled epoxy, pre-impregnated fibers (Prepreg), reinforced fibers, laminate, a mold material, a thermoset material, a thermoplastic material, filler particles, fiber-reinforced laminate, fiber-reinforced polymer laminate, fiber-reinforced polymer laminate with filler particles.

The encapsulation material 106 may be formed as one or more lamination layers. By way of example, the encapsulation material 106 may include a lamination layer at the back side of the leadframe, a lamination layer between the front side of the leadframe and the first redistribution layer 108, and a lamination layer between the first redistribution layer 108 and the second redistribution layer 110.

The chip package 100 may have a total thickness of one of equal to and less than 3 mm, e.g. equal to or less than 2 mm, e.g. one of equal to and less than 1 mm. For example, the chip 104 may have a thickness of less than or about 200 µm, each lamination layer of encapsulation material 106 may have a thickness of less than or about 100 µm, and each redistribution layers 108, 110 may have a thickness of less than or about 200 µm.

In the embodiments of FIG. 1, one chip 104 is shown in the chip package 100. It is understood that the chip package 100 may include a plurality of chips according to various embodiments as described below. The plurality of chips may be stacked one above the other and/or arranged adjacent to one another.

Figure 2:
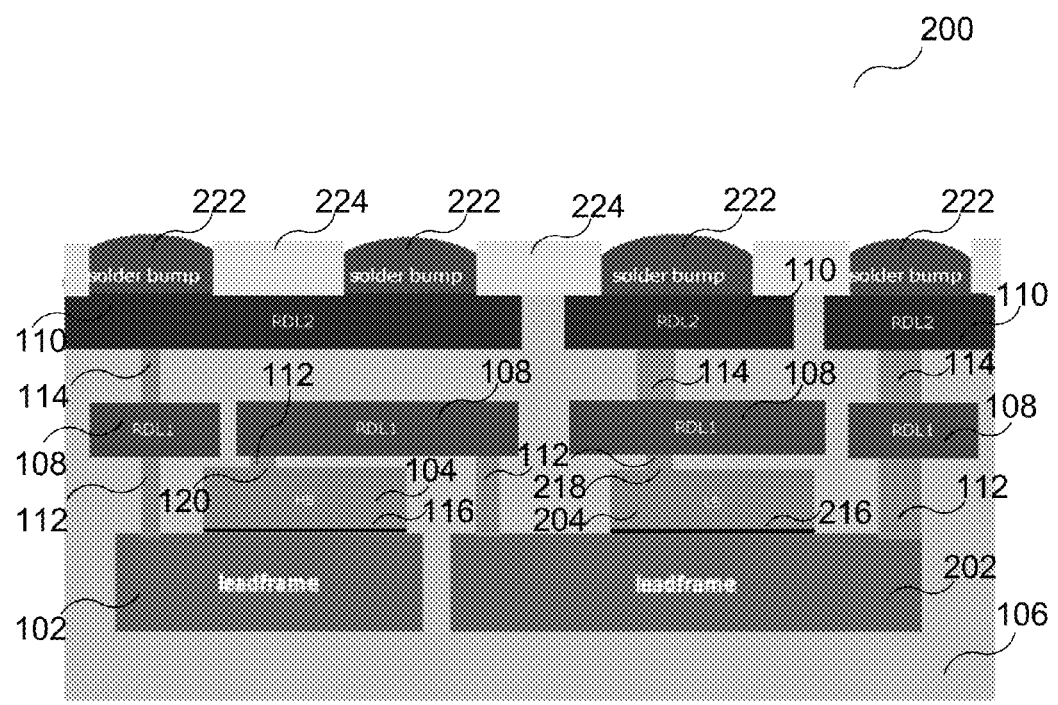
FIG. 2 shows a chip package according to various embodiments.

FIG. 2 shows a chip package 200 according to various embodiments.

Similar to the chip package 100, the chip package 200 may also include a metallic chip carrier 102; at least one chip 104 carried by the metallic chip carrier 102; encapsulation material 106 encapsulating the at least one chip 104 and the metallic chip carrier 102; and a plurality of redistribution layers 108, 110 disposed over the at least one chip 104 opposite the metallic chip carrier 102, wherein at least one redistribution layer of the plurality of redistribution layers 108, 110 is electrically coupled with the at least one chip 104. The chip package 200 may include at least one contact hole 112 extending through the encapsulation material 106 to electrically couple the at least one chip 104 with the at least one redistribution layer of the plurality of redistribution layers (e.g. the first redistribution layer 108). The chip package 200 may further include at least one further contact hole 114 extending through the encapsulation material 106 to electrically couple the plurality of redistribution layers 108, 110 with each other.

Similar to the chip package 100, the chip package 200 in the embodiments of FIG. 2 may include a first redistribution layer (RDL1) 108 and a second redistribution layer (RDL2) 110 disposed over the at least one chip 104. It is understood that in various embodiments various number of redistribution layers (e.g., three, four, five, . . . ) may be included in the chip package 200 for electrical coupling with the at least one chip 104.

Various embodiments described in the chip package 100 of FIG. 1 above are analogously valid for the chip package 200 of FIG. 2, and vice versa.

In the embodiments of FIG. 2, the chip package 200 may include a further metallic chip carrier 202 and at least one further chip 204 carried by the further metallic chip carrier 202. At least one redistribution layer of the plurality of redistribution layers 108, 110 may be electrically coupled with the at least one further chip 204. In various embodiments, at least one redistribution layer of the plurality of redistribution layers, e.g. the first redistribution layer 108 may be electrically coupled with the at least one further chip 204 through the at least one contact hole 112 extending through the encapsulation material 106.

In various embodiments, the encapsulation material 106 may encapsulate the further chip 204 and the further metallic chip carrier 202.

The metallic chip carrier 102 and the further metallic chip carrier 202 may be leadframes. The metallic chip carrier 102 and the further metallic chip carrier 202 may include the same material.

In various embodiments, the further metallic chip carrier 202 may include at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy. The further metallic chip carrier 202 may include at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

In various embodiments, the at least one further chip 204 may include a power chip. The at least one further chip 204 may include a power chip selected from a group consisting of a power diode chip and a power transistor chip. Examples of the power transistor may include but are not limited to a power MOSFET (metal oxide semiconductor field effect transistor), a JFET (junction field effect transistor), an IGBT (insulated gate bipolar transistor), a power bipolar transistor, or the like.

Similar to the chip package 100, in the embodiments of the chip package 200, the chip 104 may include at least a first contact 116 on the first chip side (e.g. the bottom side). Different from FIG. 1 which shows a second contact 118 on the second chip side (e.g. the top side) opposite the first chip side of the chip 104, the chip 104 in FIG. 2 shows a third contact 120 on the second chip side. In various embodiments, the first contact 116 may be electrically coupled to the metallic carrier 102, and the third contact 120 may be electrically coupled to at least one redistribution layer of the plurality of redistribution layers, e.g. the first redistribution layer 108.

In an embodiment, the chip 104 may include a field effect transistor. The first contact 116 may be a drain contact, and the third contact 120 may be a source contact. In an embodiment, the chip 104 may include a bipolar transistor. The first contact 116 may be a collector contact, and the third contact 120 may be a emitter contact.

In the embodiments of the chip package 200, the further chip 204 may include at least a first contact 216 on the first chip side (e.g. the bottom side) and a second contact 218 on the second chip side (e.g. the top side) opposite the first chip side of the further chip 204. The first contact 216 may be electrically coupled to the metallic carrier 202, and the second contact 218 may be electrically coupled to at least one redistribution layer of the plurality of redistribution layers, e.g. the first redistribution layer 108 and the second redistribution layer 110.

The further chip 204 may include a field effect transistor. The first contact 216 may be a drain contact, and the second contact 218 may be a gate contact. The further chip 204 may further include a source contact (not shown in FIG. 2).

Furthermore, the further chip 204 may include a bipolar transistor. The first contact 216 may be a collector contact, and the second contact 218 may be a base contact. The further chip 204 may further include a emitter contact (not shown in FIG. 2).

In various embodiments, the at least one further chip 204 may have a vertical structure in which a current may flow vertically through the further chip 204 from one main surface to the opposite other main surface of the further chip 204. In other words, the current can flow in a direction perpendicular to the main surfaces of the further chip 204. The further chip 204 having a vertical structure may have contacts on its front side and back side. By way of example, the drain contact 116 of a further power MOSFET chip 204 may be arranged on the first side of the further chip 204, while the gate contact and the source contact of the further power MOSFET chip 204 may be arranged on the second side of the further chip 204 so as to support a vertical current flow through the further chip 204 between the drain region over the first chip side and the source region over the second chip side.

In various embodiments, the at least one chip 104 and the at least one further chip 204 may be connected with each other in a bridge circuit structure, e.g. a half bridge or a full bridge circuit structure.

In an illustrative embodiment shown in FIG. 2, the chip 104 and the further chip 204 may each be a power MOSFET. The source contact 120 of the chip 104 may be electrically connected with the drain contact 216 of the further chip 204 via the first redistribution layer 108, the contact holes 112 and the further metallic chip carrier 202. The chip 104 and the further chip 204 in such an arrangement may form a half bridge circuit, wherein the chip 104 may be referred to as a high side (HS) chip of the half bridge circuit and the further chip 204 may be referred to as a low side (LS) chip of the half bridge circuit. It is understood that the chip 104 and the further chip 204 may be electrically connected with each other through the redistribution layers 108, 110 in a different manner to form the half bridge circuit, or to form other types of circuit structures.

In various embodiments, the chip package 200 may further include at least one contact pad 222 disposed over at least one redistribution layer of the plurality of redistribution layers, e.g. the second redistribution layer 110, to provide a package external electrical contact. The at least one contact pad 222 may be electrically coupled with at least one redistribution layer of the plurality of redistribution layers 108, 110. Similarly, the chip package 100 of FIG. 1 may also include at least one contact pad disposed over at least one redistribution layer of the plurality of redistribution layers 108,110, to provide a package external electrical contact, wherein the at least one contact pad may be electrically coupled with at least one redistribution layer of the plurality of redistribution layers 108, 110.

The contact pads 222 may be solder bumps. However, the contact pads 222 may also be other forms of contact pads, e.g. in the form of lands. The contact pads 222 may be insulated from each other using insulating material 224 disposed therebetween.

In an illustrative embodiment shown in FIG. 2, the contact pads 222 may be electrically connected to the first contact 116 (e.g. the drain contact) of the chip 104, the first contact 216 (e.g. the drain contact) and the second contact 218 (e.g. the gate contact) of the further chip 204 via the redistribution layers 108, 110 and the respective contact holes 112, 114.

Figure 3A:
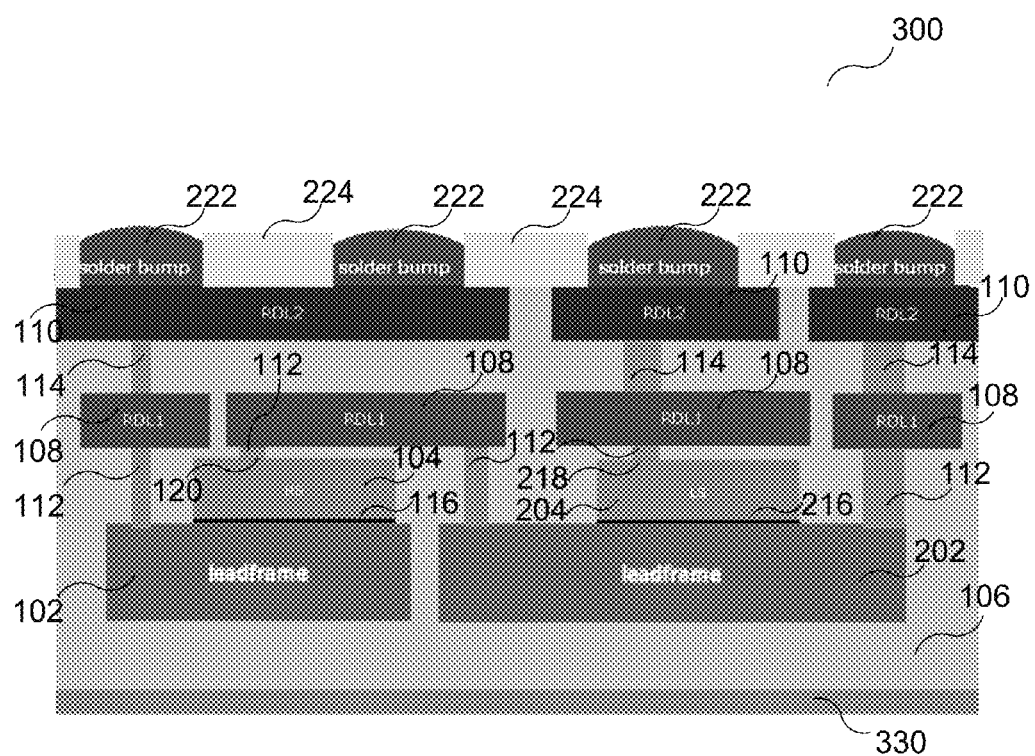
FIG. 3A shows a chip package according to various embodiments.

FIG. 3A shows a chip package 300 according to various embodiments.

The chip package 300 is similar to the chip package 200 of FIG. 2. In the embodiments of FIG. 3A, the chip package 300 may further include an electrically conductive layer 330 disposed over the metallic carrier 102 and the further metallic carrier 202 opposite the plurality of redistribution layers 108, 110. Similarly, the chip package 100 of FIG. 1 may also include an electrically conductive layer disposed over the metallic carrier opposite the plurality of redistribution layers 108, 110.

In various embodiments, the electrically conductive layer 330 may include at least one of a metal, a metal alloy, and an electrically conductive adhesive. Examples of the material of the electrically conductive layer may include but are not limited to copper, copper alloy, aluminum, resin coated copper, and the like.

The electrically conductive layer 330 may have a layer thickness in the range from about 1 μm to about 50 μm, e.g. in the range from about 2 μm to about 20 μm, e.g. in the range from about 3 μm to about 15 μm, e.g. in the range from about 5 μm to about 10 μm. For example, the layer thickness of the electrically conductive layer 330 may be about 1 μm for diffusion solder, and may be about 50 μm for soft solder.

The electrically conductive layer 330 may be patterned. In various embodiments, the electrically conductive layer 330 may include a labeling as a pattern structure made by means of a laser.

In various embodiments, the electrically conductive layer 330 may be provided for cooling purposes and/or for RF (radio frequency) shielding. For example, the electrically conductive layer 330 may be a heatsink. The electrically conductive layer 330 may also be provided as a marking layer or a labeling layer.

Figure 3B:
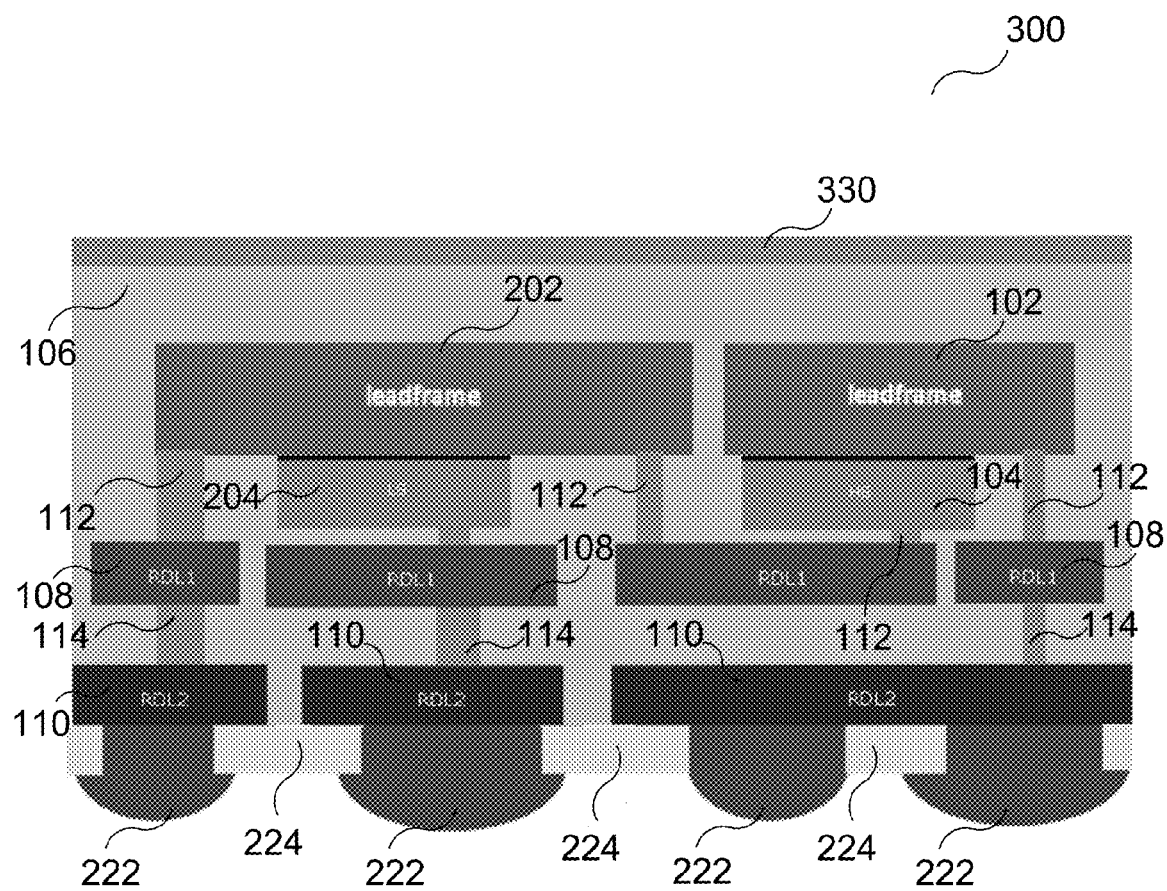
FIG. 3B shows a chip package in a flipped manner according to various embodiments.

FIG. 3B shows the chip package 300 in a flipped manner according to various embodiments.

The chip package 300 shown in FIG. 3B is the same as the chip package 300 of FIG. 3A. As shown in FIG. 3B, the chip package 300 is flipped, wherein the contact pads 222 may be further attached onto a printed circuit board. In such a manner, the chips 104, 204, being arranged with their top sides facing down, may be electrically coupled to the printed circuit board.

In the embodiments described with reference to FIGS. 1, 2, 3A and 3B above, one or two chips 104, 204 may be included in the chip package 100, 200, 300. It is understood that the chip package 100, 200, 300 may include a plurality of chips electrically connected or insulated from each other.

In various embodiments, the chip package 100, 200, 300 may further include at least one third chip electrically coupled to at least one redistribution layer of the plurality of redistribution layers. The third chip may include a logic chip, e.g. a driver chip. The logic chip may include at least one logic device from the group consisting of: an ASIC (Application Specific Integrated Circuit), a driver, a controller, a sensor.

Figure 4:
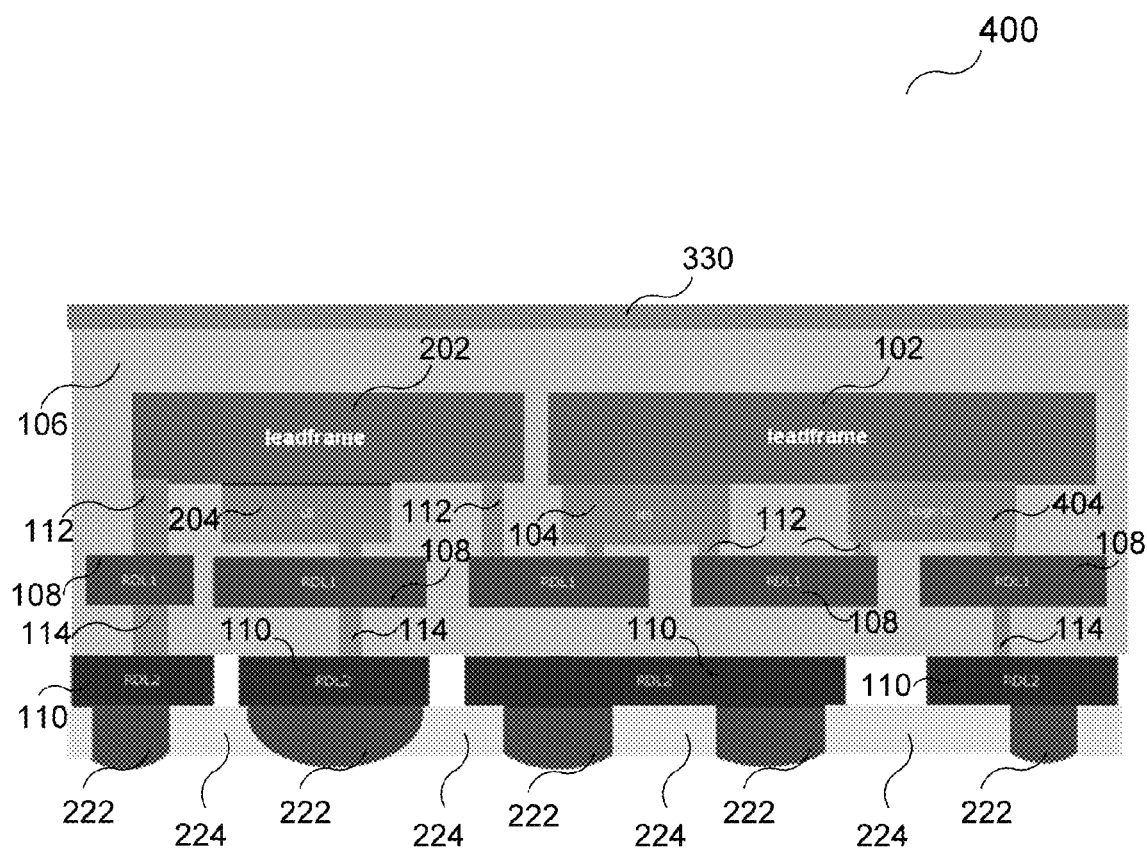
FIG. 4 shows a chip package in a flipped manner according to various embodiments.

FIG. 4 shows a chip package 400 according to various embodiments, including at least one third chip electrically coupled to at least one redistribution layer of the plurality of redistribution layers.

The chip package 400 is similar to the chip package 200, 300 of FIG. 2, FIG. 3A and FIG. 3B, but additionally includes at least one third chip 404. The at least one third chip 404 may include a logic chip, e.g. a driver chip, an ASIC chip, a controller chip, a sensor chip, or the like. In various embodiments, the at least one third chip 404 may be carried by at least one of the metallic chip carrier 102 and the further metallic chip carrier 202, e.g. the metallic chip carrier 102 as shown in FIG. 4. The at least one third chip 404 may be electrically insulated from the metallic chip carrier 102 on which it is mounted. The at least one third chip 404 may also be carried by a third metallic chip carrier (not shown in FIG. 4) separate from the metallic chip carrier 102 and the further metallic chip carrier 202.

The third chip 404 may be electrically coupled to the chip 104 and the further chip 204 through at least one redistribution layer of the plurality of redistribution layers 108, 110. For example, the third chip 404 may be electrically coupled to the respective control electrode (e.g. the gate contact or the base contact) of the chip 104 and the further chip 204 to control the chips 104, 204. In various embodiments shown in FIG. 4, the third chip 404 may be electrically coupled to the control electrode of the high side chip 104 through the first redistribution layer 108 and the contact holes 112. The third chip 404 may be electrically coupled to the at least one contact pad 222 through at least one of the metallic chip carrier 102, the plurality of redistribution layers 108, 110, or the contact holes 112, 114. In various embodiments, the third chip 404 may also be electrically coupled to the control electrode of the low side chip 204, e.g., through the plurality of redistribution layers 108, 110.

In various embodiments, the chip package 100, 200, 300, 400 may further include at least one electrical component (not shown in FIGS. 1 to 4 above) disposed over an electrically conductive layer (e.g. the electrically conductive layer 330 in FIG. 3A, FIG. 3B and FIG. 4) opposite the plurality of redistribution layers 108, 110, wherein the electrically conductive layer is disposed over the metallic chip carrier 102 and/or the further metallic chip carrier 202 opposite the plurality of redistribution layers 108, 110.

In various embodiments, the at least one electrical component may include a passive component, e.g. a capacitor, a resistor, an inductor, a diode, or the like.

Figure 5:
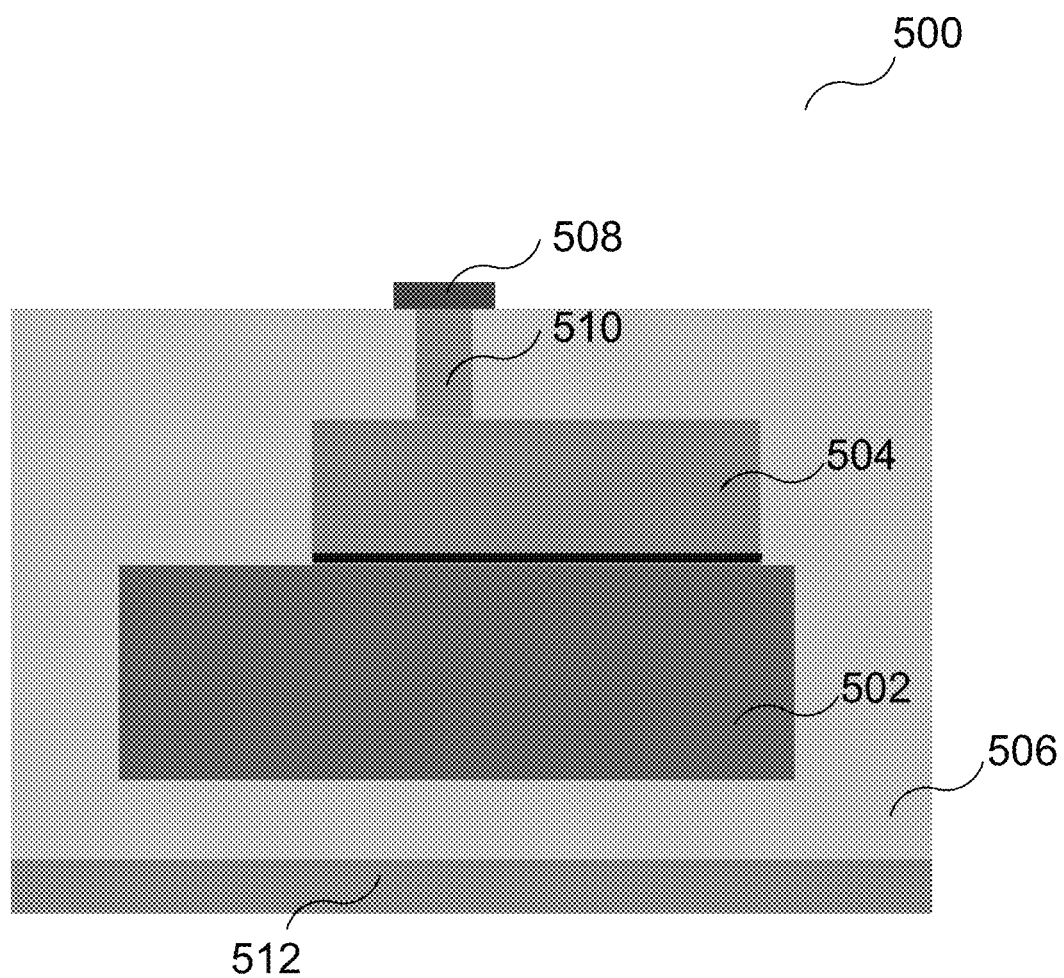
FIG. 5 shows a chip package according to various embodiments.

FIG. 5 shows a chip package 500 according to various embodiments.

The chip package 500 may include a metallic chip carrier 502, at least one chip 504 carried by the metallic chip carrier; and encapsulation material 506 encapsulating the chip 504 and the metallic chip carrier 502. The chip package 500 may further include at least one chip package external contact 508 disposed over the encapsulation material 506 and electrically coupled to the at least one chip 504. In an embodiment, the chip package external contact 508 may be electrically coupled to the at least one chip 504 through at least one contact hole 510. The chip package may further include an electrically conductive layer 512 disposed over the encapsulation material 506 opposite the at least one chip package external contact 508.

The chip carrier 502 may be a leadframe, and may include a metal or metal alloy described in various embodiments above. The chip 504 may be a power chip described in various embodiments above. The electrically conductive layer 512 may be a heatsink, for example, or may be other types of devices for cooling and/or RF shielding, or may be provided as a marking layer or a labeling layer.

The chip packages 100, 200, 300, 400, 500 described in various embodiments above may be manufactured using single device manufacturing or embedded wafer technology.

Figure 6:
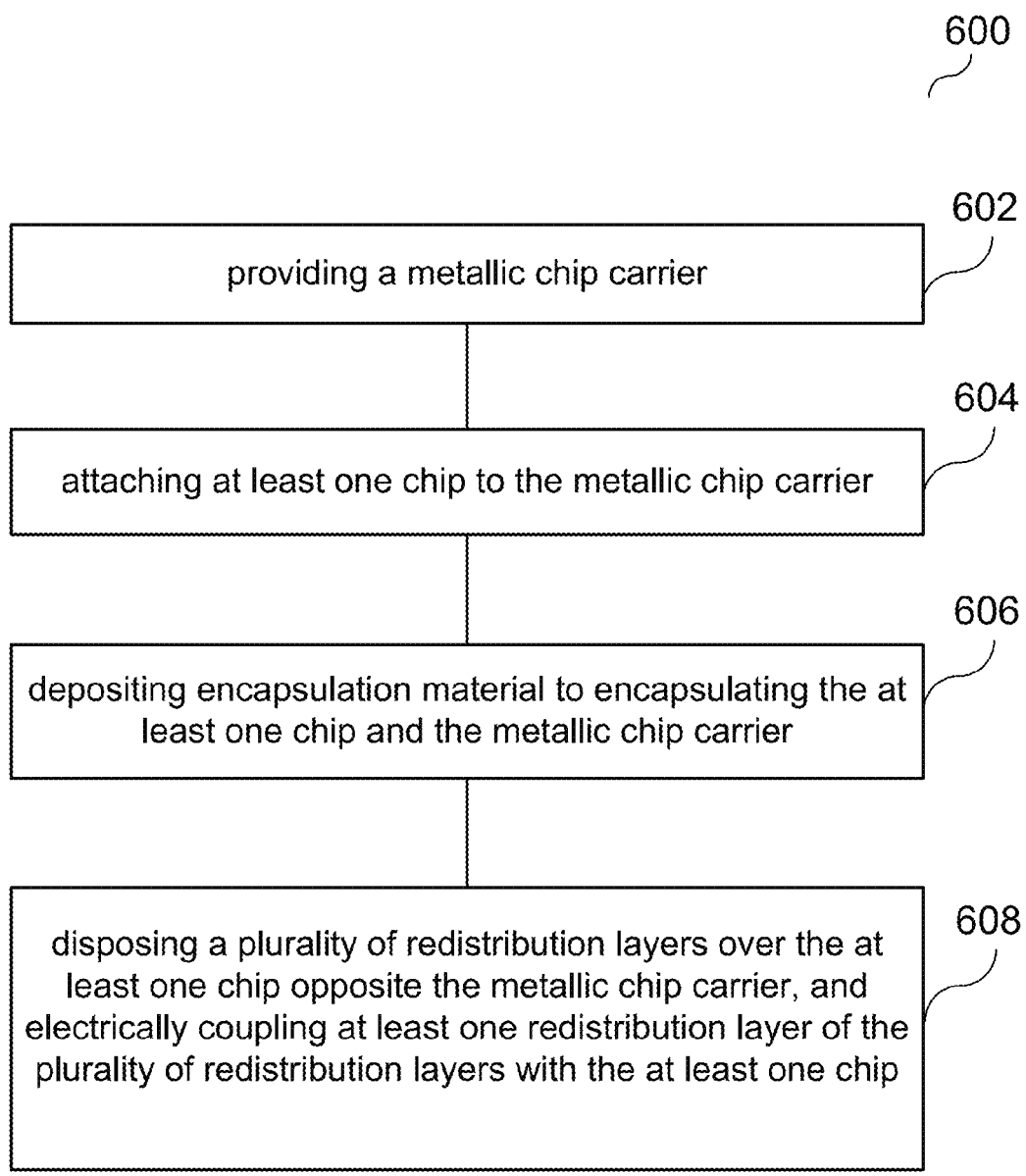
FIG. 6 shows a flowchart illustrating a method for manufacturing a chip package according to various embodiments.

FIG. 6 shows a flowchart 600 illustrating a method for manufacturing a chip package according to various embodiments.

At 602, a metallic chip carrier is provided.

At 604, at least one chip is attached to the metallic chip carrier.

In various embodiments, the at least one chip may be attached to the metallic chip carrier via a bond layer. The bond layer may include diffusion solder. In various embodiments, the at least one chip may be attached to the metallic chip carrier using electrically conductive adhesives.

At 606, encapsulation material is deposited to encapsulate the at least one chip and the metallic chip carrier.

At 608, a plurality of redistribution layers are disposed over the at least one chip opposite the metallic chip carrier, and at least one redistribution layer of the plurality of redistribution layers is electrically coupled with the at least one chip.

In various embodiments, at least one contact hole extending through the encapsulation material may be formed to electrically couple the at least one redistribution layer of the plurality of redistribution layers with the at least one chip.

In various embodiments, at least one further contact hole extending through the encapsulation material may be formed to electrically couple the plurality of redistribution layers with each other.

In various embodiments, the plurality of redistribution layers may be formed separately. For example, having deposited a layer of encapsulation material encapsulating the at least one chip and the metallic chip carrier, the at least one contact hole extending through the layer of encapsulation material may be formed. A first redistribution layer may be disposed over the at least one chip opposite the metallic chip carrier, such that the at least one contact hole is configured to electrically couple the first redistribution layer with the at least one chip. A further layer of encapsulation material may be formed over the first redistribution layer, and at least one further contact hole extending through the further layer of encapsulation material may be formed. A second redistribution layer may be disposed over the further layer of encapsulation material, such that the at least one further contact hole is configured to electrically couple the first redistribution layer with the second redistribution layer.

In various embodiments, at least one contact pad may be disposed over the plurality of redistribution layers to provide a package external electrical contact.

The process of manufacturing a chip package according to an exemplary embodiment is described below.

One or more chips may be contacted to a chip carrier. The chip carrier may be a metallic chip carrier, e.g. a leadframe, and may include electrically isolating portions. In various embodiments, the one or more chips may be power chips as described above. The power chips may be electrically conductively contacted to the chip carrier, e.g. through an electrically conductive bond layer or adhesive layer described above. In various embodiments, one or more additional chips may be contacted to the chip carrier, wherein the one or more additional chips may be logic chips as described above. The logic chips may be electrically isolated from the chip carrier, e.g. by being attached to the chip carrier via a layer of electrically insulating material.

Both sides of the chip carrier (e.g. the front side and the back side) may be laminated using a layer of encapsulation material and a layer of conductive material. For example, the layer of encapsulation material may include or may be a Prepreg (preimpregnated fiber), a polymer foil, or a metalized glass fiber strengthened polymer foil, or other encapsulation material, e.g. described in various embodiments above. The layer of conductive material may include a metal foil, and may form a first redistribution layer.

In various embodiments, one or more contact holes may be drilled for the first redistribution layer, e.g. by meanings of a laser, e.g. a $CO_2$ laser. In various embodiments, before forming the first redistribution layer, the contact holes may drilled to extend through the layer of encapsulation material, e.g. over the respective contact of the chips or additional chips. Cleaning, chemically activating and galvanic filling of the contact holes may be performed. The contact holes may be filled with electrically conductive material, such as a metal (e.g. copper) or a metal alloy. The first redistribution layer, e.g. the metal foil, may be then laminated over the layer of encapsulation material and the contact holes.

The metal foil may be patterned, such that re-wiring or redistribution of electrical connection to the chips may be achieved.

Both-sided lamination of a further layer of encapsulation material may be repeated. For example, a metalized or non-metalized glass fiber strengthened polymer foil or a layer of other encapsulation material described above may be laminated over the metal foil (i.e. the first redistribution layer) at the front side of the chip carrier, and over the chip carrier at the back side of the chip carrier.

In various embodiments, one or more further contact holes may be drilled, e.g. by meanings of a laser, e.g. a $CO_2$ laser. In various embodiments, the further contact holes may drilled to extend through the further layer of encapsulation material, e.g. over the respective predetermined location of the first redistribution layer. Cleaning, chemically activating and galvanic filling of the further contact holes may be performed. The further contact holes may be filled with electrically conductive material, such as a metal (e.g. copper) or a metal alloy. A further layer of electrically conductive material, e.g. a further metal foil, may be laminated over the further layer of encapsulation material and the further contact holes. The further metal foil may form a second redistribution layer.

The further metal foil may be patterned, such that re-wiring or redistribution of electrical connection to the chips may be achieved. The further contact holes may provide electrical connection between the first redistribution layer and the second redistribution layer at the predetermined locations.

In various embodiments, a layer of insulating material, e.g. a layer of solder stop resin, may be formed over or on the side of the chip package, which side is to be contacted with a printed circuit board. Metallic connecting terminals or contacts, e.g. solder balls or solder bumps, may be deposited for connection to the printed circuit board.

In various embodiments, an electrically conductive layer may be disposed over the metallic chip carrier opposite the plurality of redistribution layers. The electrically conductive layer may be a cooling layer, a RF shielding layer, a marking layer, or a labeling layer, e.g. a heatsink plate.

According to various embodiments above, the embedded chip carrier having one or more chips mounted thereon and being encapsulated on both sides may be electrically contacted, re-wired (or redistributed) and electrically connected to the periphery (e.g. a printed circuit board) by means of a plurality of redistribution layers (e.g. two, three, four, or more redistribution layers). The one or more chips in such a chip package may have their top side facing down. Due to a second redistribution layer and possibly additional redistribution layers, a customer-specific flexible foot print can be realized.

According to the chip package of various embodiments, a flexible foot print for the connection to the printed circuit board may be implemented in a simple manner. According to various embodiments, the chip package with good cooling is provided. According to various embodiments, a higher integration density may be achieved, and a modular construction may be possible.

Various embodiments provide a chip package. The chip package may include a metallic chip carrier; at least one chip carried by the metallic chip carrier; encapsulation material encapsulating the at least one chip and the metallic chip carrier; and a plurality of redistribution layers disposed over the at least one chip opposite the metallic chip carrier, wherein at least one redistribution layer of the plurality of redistribution layers is electrically coupled with the at least one chip.

In various embodiments the chip package may include various number of redistribution layers (e.g., two, three, four, five, . . . ), e.g., for electrical coupling with the at least one chip and with external components. The additional redistribution layers may provide a better disentangling in the z-direction (i.e. the direction perpendicular to the main surfaces of the chip) and may thus provide an improved dielectric strength of the chip package.

In various embodiments, the chip package may further include at least one contact hole extending through the encapsulation material to electrically couple the at least one chip with the at least one redistribution layer of the plurality of redistribution layers.

In various embodiments, the chip package may further include at least one further contact hole extending through the encapsulation material to electrically couple the plurality of redistribution layers with each other.

In various embodiments, the at least one chip may include at least a first contact on a first chip side (e.g. the back side) and a second contact on a second chip side (e.g. the front side) opposite the first chip side.

In various embodiments, the first contact may be electrically coupled to the metallic carrier. The second contact may be electrically coupled to at least one redistribution layer of the plurality of redistribution layers.

In an embodiment, the at least one chip may include a field effect transistor. The first contact may be a drain contact, and the second contact may be a gate contact. The chip may further include a source contact.

In an embodiment, the at least one chip may include a bipolar transistor. The first contact may be a collector contact, and the second contact may be a base contact. The chip may further include a emitter contact.

In various embodiments, the at least one chip may have a vertical structure in which a current may flow vertically through the chip from one main surface to the opposite other main surface of the chip. In other words, the current can flow in a direction perpendicular to the main surfaces of the chip. The chip having a vertical structure may have contacts on its front side and back side. By way of example, the drain contact of a power MOSFET chip may be arranged on the first side of the chip, while the gate contact and the source contact of the power MOSFET chip may be arranged on the second side of the chip so as to support a vertical current flow through the chip between the drain region over the first chip side and the source region over the second chip side.

In various embodiments, the at least one chip may include a power chip. In various embodiments, the at least one chip may include a power chip selected from a group consisting of a power diode and a power transistor. Examples of the power transistor may include but are not limited to a power MOSFET (metal oxide semiconductor field effect transistor), a JFET (junction field effect transistor), an IGBT (insulated gate bipolar transistor), a power bipolar transistor, or the like.

In various embodiments, the encapsulation material may include or may be a material selected from a group of materials consisting of: mold material (e.g. press mold material) and lamination material (e.g. polymer material with glass fibers). In various embodiments, the encapsulation material may include at least one from the following group of materials, the group consisting of: filled or unfilled epoxy, pre-impregnated fibers (Prepreg), reinforced fibers, laminate, a mold material, a thermoset material, a thermoplastic material, filler particles, fiber-reinforced laminate, fiber-reinforced polymer laminate, fiber-reinforced polymer laminate with filler particles.

The encapsulation material may be formed as one or more lamination layers. By way of example wherein the chip package includes a first redistribution layer and a second redistribution layer, the encapsulation material may include a lamination layer at the back side of the leadframe, a lamination layer between the front side of the leadframe and the first redistribution layer, and a lamination layer between the first redistribution layer and the second redistribution layer.

In various embodiments, the chip package may include a further metallic chip carrier and at least one further chip carried by the further metallic chip carrier. At least one redistribution layer of the plurality of redistribution layers may be electrically coupled with the at least one further chip. In various embodiments, at least one redistribution layer of the plurality of redistribution layers may be electrically coupled with the at least one further chip through the at least one contact hole extending through the encapsulation material.

In various embodiments, the encapsulation material may encapsulate the further chip and the further metallic chip carrier.

The metallic chip carrier and the further metallic chip carrier may be leadframes. In an embodiment, the metallic chip carrier and the further metallic chip carrier may include the same material.

In various embodiments, at least one of the metallic chip carrier and the further metallic chip carrier may include at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy. In various embodiments, at least one of the metallic chip carrier and the further metallic chip carrier may include at least one from the following group of materials, the group of materials consisting of: NiPdAu, NiAu, NiPd, NiAuAg, NiPdAuAg, NiNiPPdAu, NiNiPAu, NiNiPPd, NiNiPAuAg, NiNiPPdAuAg.

In various embodiments, at least one of the metallic chip carrier and the further metallic chip carrier may include a material including a roughness ranging from about 1 nm to 1000 nm. In various embodiments, at least one of the metallic chip carrier and the further metallic chip carrier may include a material having a porosity ranging from about 2% to 50%.

In various embodiments, the at least one further chip may include a power chip. In various embodiments, the at least one further chip may include a power chip selected from a group consisting of a power diode and a power transistor. Examples of the power transistor may include but are not limited to a power MOSFET (metal oxide semiconductor field effect transistor), a JFET (junction field effect transistor), an IGBT (insulated gate bipolar transistor), a power bipolar transistor, or the like.

In various embodiments, the at least one further chip may include at least a first contact on the first chip side (e.g. the bottom side) and a second contact on the second chip side (e.g. the top side) opposite the first chip side of the further chip. In various embodiments, the first contact may be electrically coupled to the further metallic carrier, and the second contact may be electrically coupled to at least one redistribution layer of the plurality of redistribution layers.

In an embodiment, the further chip may include a field effect transistor. The first contact may be a drain contact, and the second contact may be a gate contact. The further chip may further include a source contact.

In an embodiment, the further chip may include a bipolar transistor. The first contact may be a collector contact, and the second contact may be a base contact. The further chip may further include a emitter contact.

In various embodiments, the at least one further chip may have a vertical structure in which a current may flow vertically through the further chip from one main surface to the opposite other main surface of the further chip. In other words, the current can flow in a direction perpendicular to the main surfaces of the further chip. The further chip having a vertical structure may have contacts on its front side and back side. By way of example, the drain contact of a further power MOSFET chip may be arranged on the first side of the further chip, while the gate contact and the source contact of the further power MOSFET chip may be arranged on the second side of the further chip so as to support a vertical current flow through the further chip between the drain region over the first chip side and the source region over the second chip side.

In various embodiments, the at least one chip and the at least one further chip may be connected with each other in a bridge circuit structure, e.g. a half bridge or a full bridge circuit structure.

In various embodiments, the chip and the further chip may each be a power MOSFET. The source contact of the chip may be electrically connected with the drain contact of the further chip through at least one of the plurality of redistribution layers. The chip and the further chip in such an arrangement may form a half bridge circuit, wherein the chip may be referred to as a high side (HS) chip of the half bridge circuit and the further chip may be referred to as a low side (LS) chip of the half bridge circuit. It is understood that the chip and the further chip may be electrically connected with each other through the redistribution layers in a different manner to form the half bridge circuit, or to form other types of circuit structures.

In various embodiments, the chip package may further include at least one contact pad disposed over at least one redistribution layer of the plurality of redistribution layers to provide a package external electrical contact. The at least one contact pad may be electrically coupled with at least one redistribution layer of the plurality of redistribution layers.

In an embodiment, the contact pads may be solder bumps. In various embodiments, the contact pads may be other forms of contact pads, e.g. in the form of lands. The contact pads may be insulated from each other using insulating material disposed therebetween.

In various embodiments, the chip package may further include an electrically conductive layer disposed over the metallic carrier opposite the plurality of redistribution layers. In various embodiments, the electrically conductive layer may be disposed over the further metallic carrier opposite the plurality of redistribution layers.

In various embodiments, the electrically conductive layer may include at least one of a metal, a metal alloy, or an electrically conductive adhesive. Examples of the material of the electrically conductive layer may include but are not limited to copper, copper alloy, aluminum, resin coated copper, and the like.

In various embodiments, the electrically conductive layer may have a layer thickness in the range from about 1 μm to about 50 μm, e.g. in the range from about 2 μm to about 20 μm, e.g. in the range from about 3 μm to about 15 μm, e.g. in the range from about 5 μm to about 10 μm. For example, the layer thickness of the electrically conductive layer may be about 1 μm for diffusion solder, and may be about 50 μm for soft solder.

In various embodiments, the electrically conductive layer may be patterned. In various embodiments, the electrically conductive layer may include a labeling as a pattern structure made by means of a laser.

In various embodiments, the electrically conductive layer may be provided for cooling purposes and/or for RF (radio frequency) shielding. For example, the electrically conductive layer may be a heatsink. The electrically conductive layer may also be provided as a marking layer or a labeling layer.

In various embodiments, the chip package may include a plurality of chips electrically connected or insulated from each other.

In various embodiments, the chip package may further include at least one third chip electrically coupled to at least one redistribution layer of the plurality of redistribution layers. The third chip may include a logic chip, e.g. a driver chip. In various embodiment, the logic chip may include at least one logic device from the group consisting of: an ASIC, a driver, a controller, a sensor.

In various embodiments, the at least one third chip may be carried by at least one of the metallic chip carrier and the further metallic chip carrier. The at least one third chip may be electrically insulated from the at least one of the metallic chip carrier and the further metallic chip carrier on which it is mounted. In various embodiments, the at least one third chip may be carried by a third metallic chip carrier separate from the metallic chip carrier and the further metallic chip carrier. The third chip may be electrically coupled to the chip and the further chip through at least one redistribution layer of the plurality of redistribution layers. For example, the third chip may be electrically coupled to the respective control electrode (e.g. the gate contact or the base contact) of the chip and the further chip to control the chip and the further chip.

In various embodiments, the chip package may further include at least one electrical component disposed over an electrically conductive layer opposite the plurality of redistribution layers, wherein the electrically conductive layer is disposed over the metallic chip carrier and/or the further metallic chip carrier opposite the plurality of redistribution layers.

In various embodiments, the at least one electrical component may include a passive component, e.g. a capacitor, a resistor, an inductor, a diode, or the like.

The chip package may have a total thickness of one of equal to and less than 3 mm, e.g. equal to or less than 2 mm, e.g. one of equal to and less than 1 mm. For example, the chip may have a thickness of about 200 μm, each lamination layer of encapsulation material may have a thickness of about 100 μm, and each of the redistribution layers may have a thickness of about 200 μm.

Various embodiments provide a chip package. The chip package may include a metallic chip carrier, at least one chip carried by the metallic chip carrier; and encapsulation material encapsulating the chip and the metallic chip carrier. The chip package may further include at least one chip package external contact disposed over the encapsulation material and electrically coupled to the at least one chip. The chip package may further include an electrically conductive layer disposed over the encapsulation material opposite the at least one chip package external contact.

In various embodiment, the chip package external contact may be electrically coupled to the at least one chip through at least one contact hole extending through the encapsulation material.

The chip carrier may be a leadframe, and may include a metal or metal alloy described in various embodiments above. The chip may be a power chip described in various embodiments above. The electrically conductive layer may be a heatsink, for example, or may be other types of devices for cooling and/or RF shielding and/or marking and/or labeling.

Various embodiments provide a method for manufacturing a chip package. The method may include providing a metallic chip carrier; attaching at least one chip to the metallic chip carrier; depositing encapsulation material to encapsulate the at least one chip and the metallic chip carrier; disposing a plurality of redistribution layers over the at least one chip opposite the metallic chip carrier, and electrically coupling at least one redistribution layer of the plurality of redistribution layers with the at least one chip.

In various embodiments, the at least one chip may be attached to the metallic chip carrier via a bond layer. The bond layer may include diffusion solder. In various embodiments, the at least one chip may be attached to the metallic chip carrier using electrically conductive adhesives.

In various embodiments, at least one contact hole extending through the encapsulation material may be formed to electrically couple the at least one redistribution layer of the plurality of redistribution layers with the at least one chip.

In various embodiments, at least one further contact hole extending through the encapsulation material may be formed to electrically couple the plurality of redistribution layers with each other.

In various embodiments, the plurality of redistribution layers may be formed separately. For example, having deposited a layer of encapsulation material encapsulating the at least one chip and the metallic chip carrier, the at least one contact hole extending through the layer of encapsulation material may be formed. A first redistribution layer may be disposed over the at least one chip opposite the metallic chip carrier, such that the at least one contact hole is configured to electrically couple the first redistribution layer with the at least one chip. A further layer of encapsulation material may be formed over the first redistribution layer, and at least one further contact hole extending through the further layer of encapsulation material may be formed. A second redistribution layer may be disposed over the further layer of encapsulation material, such that the at least one further contact hole is configured to electrically couple the first redistribution layer with the second redistribution layer.

In various embodiments, at least one contact pad may be disposed over the plurality of redistribution layers to provide a package external electrical contact.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package comprising:
   a metallic chip carrier;
   at least one chip carried by the metallic chip carrier;
   encapsulation material encapsulating the at least one chip and the metallic chip carrier;
   a plurality of redistribution layers disposed over the at least one chip opposite the metallic chip carrier, wherein at least one redistribution layer of the plurality of redistribution layers is electrically coupled with the at least one chip;
   at least one contact hole extending through the encapsulation material to electrically couple the at least one chip with the at least one of the plurality of redistribution layers; and
   an electrically conductive layer disposed over the metallic chip carrier opposite the plurality of redistribution layers.

2. The chip package of claim 1, further comprising:
   a further metallic chip carrier; and
   at least one further chip carried by the further metallic chip carrier;
   wherein at least one redistribution layer of the plurality of redistribution layers is electrically coupled with the at least one further chip.

3. The chip package of claim 1,
   wherein the at least one chip comprises at least a first contact on a first chip side and a second contact on a second chip side opposite the first chip side.

4. The chip package of claim 3,
   wherein the first contact is electrically coupled to the metallic carrier; and
   wherein the second contact is electrically coupled to at least one redistribution layer of the plurality of redistribution layers.

5. The chip package of claim 4,
   wherein the at least one chip comprises a field effect transistor;
   wherein the first contact is a drain contact;
   wherein the second contact is a gate contact; and
   wherein the at least one chip further comprises a source contact.

6. The chip package of claim 4,
   wherein the at least one chip comprises a bipolar transistor;
   wherein the first contact is a collector contact;
   wherein the second contact is a base contact; and
   wherein the at least one chip further comprises a emitter contact.

7. The chip package of claim 1,
   wherein the at least one chip comprises a power chip.

8. The chip package of claim 1,
   wherein the power chip comprises a power chip selected from a group consisting of:
   a power diode; and
   a power transistor.

9. The chip package of claim 2,
   wherein the at least one further chip comprises a further power chip.

10. The chip package of claim 9,
    wherein the further power chip comprises a power chip selected from a group consisting of:
    a power diode; and
    a power transistor.

11. The chip package of claim 1, further comprising:
    at least one further contact hole extending through the encapsulation material to electrically couple the plurality of redistribution layers with each other.

12. The chip package of claim 1, further comprising:
    at least one contact pad disposed over at least one redistribution layer of the plurality of redistribution layers to provide a package external electrical contact.

13. The chip package of claim 12,
    wherein the at least one contact pad is electrically coupled with at least one redistribution layer of the plurality of redistribution layers.

14. The chip package of claim 1,
    wherein the encapsulation material is a material selected from a group of materials consisting of:
    mold material; and
    lamination material.

15. The chip package of claim 1,
    wherein the electrically conductive layer comprises at least one of a metal, a metal alloy and an electrically conductive adhesive.

16. The chip package of claim 1,
    wherein the electrically conductive layer has a layer thickness in the range from about 1 μm to about 50 μm.

17. The chip package of claim 1,
    wherein the electrically conductive layer is patterned.

18. The chip package of claim 2, further comprising
    wherein the at least one chip and the at least one further chip are connected with each other in a bridge circuit structure.

19. The chip package of claim 1, further comprising
    at least one third chip electrically coupled to at least one redistribution layer of the plurality of redistribution layers.

20. The chip package of claim 19,
    wherein the third chip comprises a logic chip.

21. The chip package of claim 1, wherein chip package has a total thickness of one of equal to and less than 3 mm.

22. The chip package of claim 1, further comprising:
at least one electrical component disposed over the electrically conductive layer opposite the plurality of redistribution layers.

23. A chip package comprising: a metallic chip carrier; at least one chip carried by the metallic chip carrier; encapsulation material encapsulating the chip and the metallic chip carrier; a plurality of redistribution layers disposed over the at least one chip opposite the metallic chip carrier, encapsulation material encapsulating the chip and the metallic chip carrier; at least one chip package external contact disposed over the encapsulation material and electrically coupled to the at least one chip; and
 an electrically conductive layer disposed over the metallic chip carrier opposite the at least one chip package external contact; and
 at least one electrical component disposed over the electrically conductive layer opposite the plurality of redistribution layers.

24. A chip package comprising:
a metallic chip carrier;
at least one chip carried by the metallic chip carrier;
encapsulation material encapsulating the at least one chip and the metallic chip carrier;
a plurality of redistribution layers disposed over the at least one chip opposite the metallic chip carrier, wherein at least one redistribution layer of the plurality of redistribution layers is electrically coupled with the at least one chip; and
an electrically conductive layer disposed over the metallic chip carrier opposite the plurality of redistribution layers; and
at least one electrical component disposed over the electrically conductive layer opposite the plurality of redistribution layers.

\* \* \* \* \*